US005430300A

United States Patent [19]

Yue et al.

[11] Patent Number: 5,430,300

[45] Date of Patent: Jul. 4, 1995

[54] OXIDIZED POROUS SILICON FIELD EMISSION DEVICES

[75] Inventors: Wing K. Yue, College Station; Donald L. Parker, Bryan; Mark H. Weichold, College Station, all of Tex.

[73] Assignee: The Texas A&M University System, College Station, Tex.

[21] Appl. No.: 226,397

[22] Filed: Apr. 12, 1994

Related U.S. Application Data

[63] Continuation of Ser. No. 732,374, Jul. 18, 1991, abandoned.

[51] Int. Cl.[6] .................... H01J 37/073

[52] U.S. Cl. .................... 250/423 F; 445/50; 445/51

[58] Field of Search .................... 250/423 F, 306, 309, 250/310, 311; 445/50, 51, 24; 313/336, 309, 351

[56] References Cited

U.S. PATENT DOCUMENTS

| | | | |
|---|---|---|---|
| 3,970,887 | 7/1976 | Smith et al. | 250/423 F |
| 4,144,636 | 3/1979 | Burkhardt et al. | 29/590 |
| 4,252,833 | 10/1979 | Kane et al. | 250/423 F |
| 4,338,164 | 7/1982 | Spohr | 204/4 |
| 4,380,865 | 4/1983 | Frye et al. | 29/576 W |
| 4,801,380 | 1/1989 | Parker et al. | 210/500.21 |
| 5,141,459 | 8/1992 | Zimmerman | 445/50 |
| 5,173,634 | 12/1992 | Kane | 445/51 |
| 5,191,217 | 3/1993 | Kane et al. | 250/423 F |
| 5,203,731 | 4/1993 | Zimmerman | 445/51 |
| 5,219,310 | 6/1993 | Tomo et al. | 445/51 |
| 5,302,238 | 4/1994 | Roe et al. | 445/51 |

OTHER PUBLICATIONS

Yue, Wing Kong, et al., "Electron Field Emission in Porous Silicon", Dissertation, Submitted to the Office of Graduate Studies of Texas A & M University, Aug., 1991.

Stewart, D., et al., "Recent Developments in Broad Area Field Emission Cold Cathodes", *Vacuum*, vol. 30, No. 11/12, pp. 527–532, 1980.

Mitterauer, J., "Miniaturized Liquid Metal Ion Sources (MILMIS)", Paper presented at the 3rd Int. Vacuum Microelectronic Conference, Monterey, Calif., Jul. 1990.

Kirkpatrick, D., et al., "Open, Ungated Cathode Microstructures: Sources and Considerations", Paper presented at the 3rd Int. Vacuum Microelectronic Conference, Monterey, Calif., Jul. 1990.

Tsong, T., "Dynamics and stability of Field Emitter Surfaces", Paper presented at the 3rd Int. Vacuum Microelectronic Conf., Monterey, Calif., Jul. 1990.

Orvis, W. J., et al., "A Progress Report on the Livermore Miniature Vacuum Tube Project", *Technical Digest* 1989, IEEE IEDM (1989), pp. 529–531, Dec. 1989.

Beale, M. I. J., et al., "An Experimental and Theoretical Study of the Formation and Microstructure of Porous Silicon", *Journal of Crystal Growth*, vol. 73, pp. 622–636, 1985.

Noer, R. J., "Electron Field Emission From Broad-area Electrodes", *J. Appl. Phys.*, vol. A28, pp. 1–24, 1982.

Herino, R. et al., "Microstructure of Porous Silicon and Its Evolution with Temperature", *Materials Letters*, vol. 2, No. 6A & B, pp. 519–523, Sep. 1984.

Arita, Yoshinobu, et al., "Thermal Behavior of Porous Silicon", *Japanese Journal of Applied Physics*, vol. 15, No. 9, p. 1664, Sep. 1976.

*Primary Examiner*—Jack I. Berman
*Assistant Examiner*—James Beyer
*Attorney, Agent, or Firm*—Baker & Botts

[57] ABSTRACT

A low voltage vacuum field emission device and method for manufacturing is provided. The devices are fabricated by anodizing a heavily doped silicon wafer substrate (12) in concentrated HF solution, forming extremely sharp silicon tips (18) at the silicon to porous silicon interface. The resulting porous silicon layer is then oxidized, and a metal film (22) is deposited by evaporation on the porous silicon. Silicon substrate (12) is the cathode, and metal film dots (22) are the anodes. The I-V characteristics for the field emission devices follow Fowler-Nordheim curves over three decades of current. The I-V characteristics are also utterly independent of temperature up to 250° C. When the oxidized porous silicon layer (OPSL) is about 5000 Å, substantial current is obtained with less than 10 volts. Recent experiments leave no doubt that the charge transport is in the vacuum of the pores. A silicon wafer that contains an OPSL may prove to be a very useful material for the fabrication of low voltage, low noise field emitters for vacuum microelectronics.

13 Claims, 5 Drawing Sheets

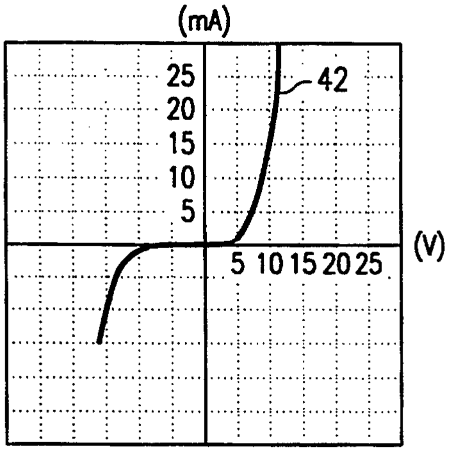
FIG. 5
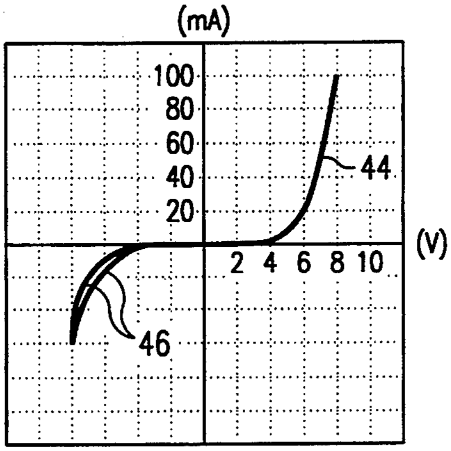
FIG. 6
FIG. 7
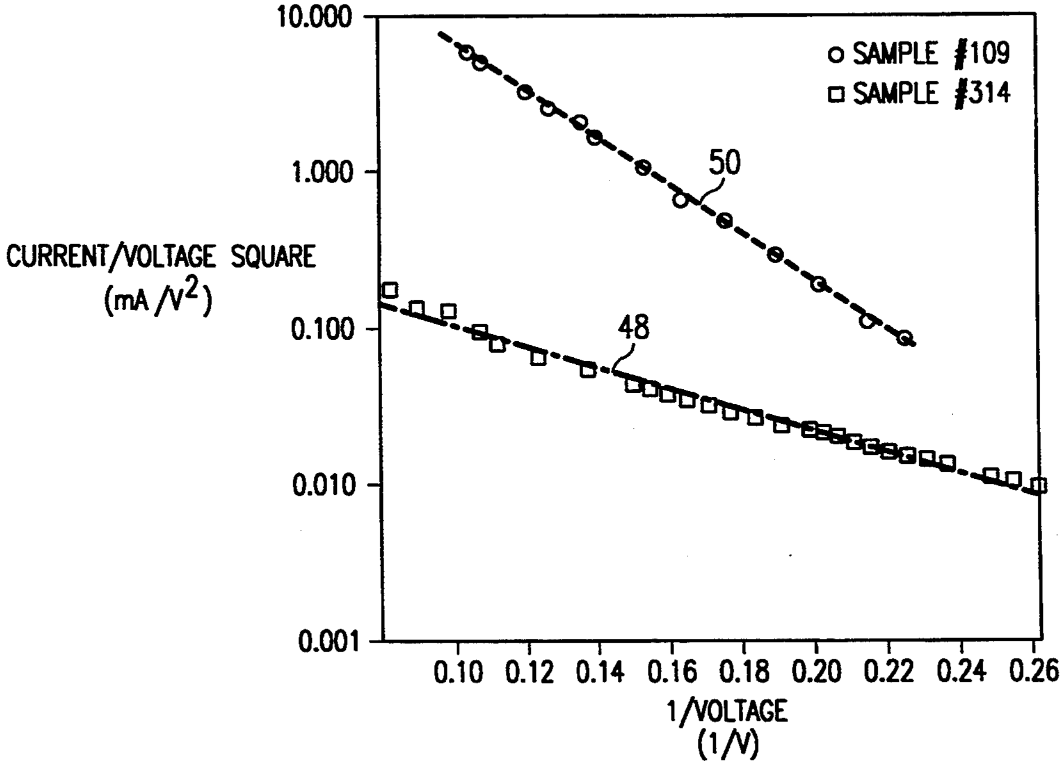

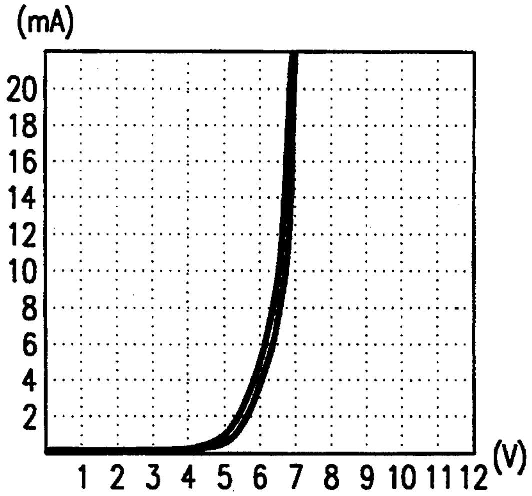
FIG. 9c
FIG. 10
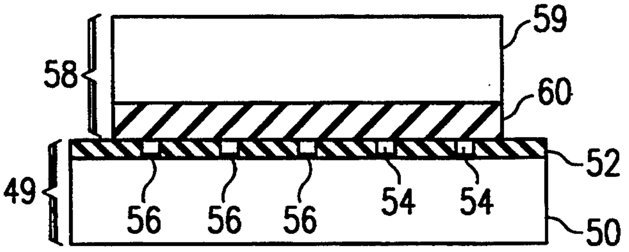
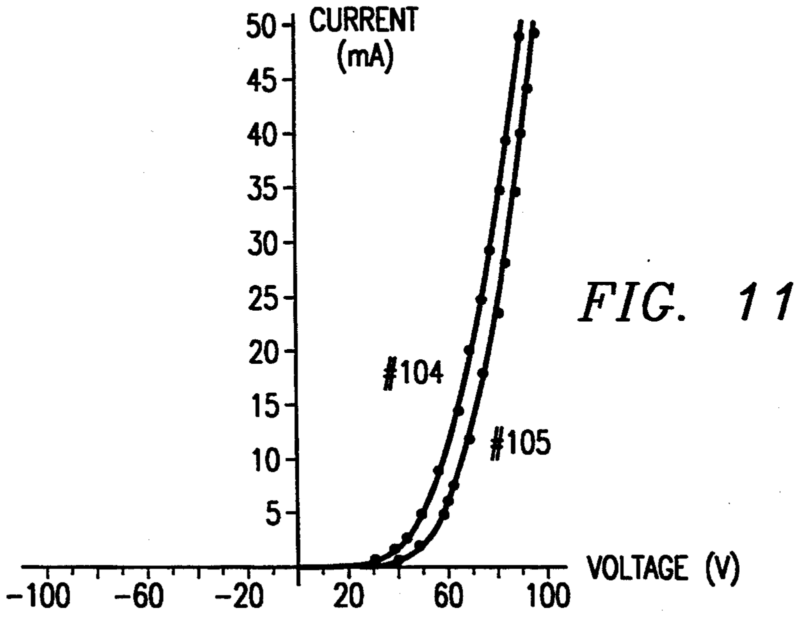
FIG. 11

OXIDIZED POROUS SILICON FIELD EMISSION DEVICES

CROSS REFERENCE TO RELATED APPLICATIONS

This application is a continuation of application Ser. No. 07/732,374 filed Jul. 18, 1991, entitled "Oxidized Porous Silicon Field Emission Devices" by Wing K. Yue, Donald L. Parker and Mark H. Weichold, now abandoned.

TECHNICAL FIELD OF THE INVENTION

This invention relates in general to the field of electronic devices, and more particularly to an improved field emission device and method for manufacturing same.

BACKGROUND OF THE INVENTION

The current structure of the field emission devices is based on the minute cones developed by Spindt and his co-workers some twenty years ago, a.k.a. Spindt's Structure. See U.S. Pat. Nos. 3,755,704, 3,789,471, and 3,812,559 issued to C. A. Spindt, K. R. Shoulders, and L. N. Heynick. Since then, great effort has been made to reduce the operating voltage of field emission devices from over 100 volts down to 40 volts, as documented in "A Progress Report on the Livermore Miniature Vacuum Tube Project," by W. J Orvis, D R. Ciarlo, C. F. McConaghy, J. H. Yee, E. Hee, C. Hent, and J. Trujillo, Technical Digest 1989, IEEE, IEDM (December, 1989). There has also been efforts made to reduce the emission noise of these devices by increasing the cone packing density to the order of 104 cones per square millimeter. Unfortunately, these voltage reductions and packing densities almost reach the limits of Spindt's structure.

SUMMARY OF THE INVENTION

Therefore, a need has arisen for a field emission device which operates at a reduced voltage and is a low noise device. In accordance with the present invention, a low noise field emission device and method of manufacturing same are provided which substantially eliminate or reduce disadvantages and problems associated with prior field emission devices and their method of manufacture.

In accordance with the present invention is provided a method of fabricating an electron-emitting source. The method comprises the steps of anodizing a doped silicon substrate to form a plurality of pores with sharp silicon tips at the bottom of the pores. The pores transport electrons emitted from the silicon tips when voltage is applied to the source. More specifically, the porous silicon film may be oxidized, and a metal film may be deposited on top of the porous silicon film (oxidized or non-oxidized) to catch electrons emitted from the silicon tips.

Porous silicon and its oxide have a technical advantage of having pore widths of 10 Å to 1000 Å with a density of 20% to 80% of that of bulk silicon. See "An Experimental and Theoretical Study of the Formation and Microstructure of Porous Silicon" Journal of Crystal Growth, Vol. 73, pp. 622–636, 1985, by M. I. J. Beale, J. D. Benjamin, M. J. Uren, N. G. Chew, and A. G. Cullis; "Fabrication of Porous Silicon Membranes" Thesis, Texas A&M University, May, 1988, by W. K. Yue; "Microstructure of Porous Silicon and Its Evolution with Temperature", Material Letters, Vol. 2, No. 6A&B, pp. 519–523, September, 1984, by R. Herino, A. Perio, K. Barla, and G. Bornchil; and "Thermal Behavior of Porous Silicon", Japanese Journal of Applied Physics," Vol. 15, No. 9, pp. 1655–1664, September, 1976, by Y. Arita, K. Kuranarij and Y. Sunohara. The structure inside the pores of heavily doped silicon is similar to Spindt's structure. Porous silicon or its oxide provides the insulated wall and the silicon substrate provides the emitter, with the benefit of the dimensions being hundreds or thousands of times smaller than that of Spindt's structure. In addition, the thickness and pore width of the porous silicon films on silicon wafers can be controlled by the reaction time and the current density in anodization of the wafer. Spindt's structure does not have equivalent controlling limits.

Another technical advantage of the present invention is that it is not difficult to make a porous silicon film with a thickness from 100 Å to several microns and a pore density from $10^8$ to $10^{11}$ pores per square millimeter. Furthermore, on the interface between porous silicon and bulk silicon, extremely sharp silicon tips are formed with tip density being very near the pore density. These tips can be used as an electron field emission source as documented in "Porous Silicon Electron-Emitting Source", submitted to the 1990 International Electron Devices Meeting by the inventors.

Another technical advantage of the present invention is that silicon has a lower work function and more resistance to contamination than many metals that are used in available field emission devices. The present invention provides the technical advantage of providing electron emission at potentials of 3 to 6 volts which is compatible with the power being supplied to conventional semiconductor circuits. The present invention also provides the technical advantages of a stable current-to-voltage relationship over a temperature range from 25° C. up to 250° C., and a current-to-voltage characteristic that follows the Fowler-Nordheim (FN) relationship over three decades of current.

Therefore, a low operating voltage and low noise field emission device can be made in porous silicon or oxidized porous silicon. The devices of the present invention are likely to find applications in the manufacture of high frequency diodes and triodes, flat panel display devices, as well as in VLSI vacuum microelectronic circuits.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 5 depicts the I-V curve for OPSFED sample #314;

FIG. 6 depicts the I-V curve for OPSFED sample #109;

FIG. 7 depicts the Fowler-Nordheim plots for OPSFED samples #314 and #109;

FIGS. 9*a–c* depict the I-V curves for OPSFED sample #109 at different curve tracer ranges;

FIG. 10 depicts a cross-sectional view of the structure of the devices used in confirming electron vacuum transport in the field emission devices of the present invention;

FIG. 11 depicts the I-V curves for emitter structures #104 and #105;

DETAILED DESCRIPTION OF THE INVENTION

Figure 1:
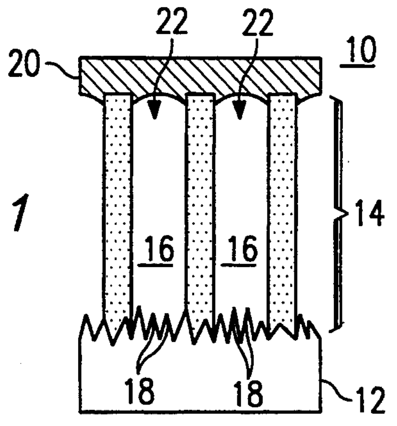
FIG. 1 is the scheme of the oxidized porous silicon field emission diodes (OPSFED)

The preferred embodiments of the present invention are illustrated in FIGS. 1–13 of the drawings, like numerals being used to refer to like and corresponding parts of the various drawings. FIG. 1 is the scheme of the oxidized porous silicon field emission diodes 10 (OPSFED) of the present invention. A thin porous silicon film is made by shallow electrochemical anodization of heavily doped silicon wafer substrate 12. The porous silicon film is subsequently oxidized, forming the oxidized porous silicon layer 14 with vacuum pores 16 which frame the OPSFEDs 10. On the bottom of the structure, the emitters of the diodes are silicon tips 18 that protrude into vacuum pores 16. Silicon tips 18 are formed on the silicon substrate during anodization. Metal film 20 is formed on top of oxidized porous silicon 14 to form anodes 22. Pores 16 formed in oxidized porous silicon 14 are perpendicular to metal film surface 18 throughout porous silicon layer 14.

The turn-on voltage of the OPSFED of FIG. 1 can be as low as 3 to 4 volts. Because of the very large ratio of voltage to the radius of silicon tip 18 when voltage is applied to OPSFED 10, silicon tips 18 formed at the silicon/porous silicon interface allow for field extraction of electrons from substrate 12. Electrons are transported from substrate 12 by vacuum transport in vacuum pores 16 from the silicon tips 18. A 1.4 mm×1.4 mm anode can collect up to 0.5 amps of current at below 10 volts. Also, the I-V characteristics of OPSFEDS 10 follows the Fowler-Nordheim (FN) relationship over three decades of current and the I-V relations are stable with temperatures ranging from 25° C. up to 250° C.

SAMPLE PREPARATION

Figure 2:
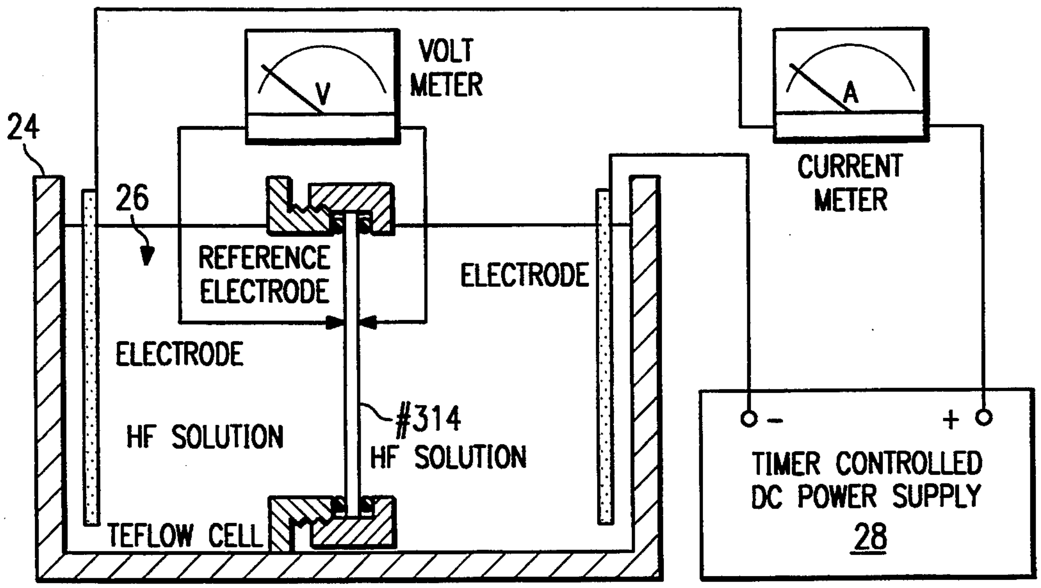
FIG. 2 is a reaction chamber for making porous silicon films.

Two samples are used to better explain the inventive concepts of the present invention. One sample is n-type wafer #314 and the other is p-type wafer #109. The #314 wafer is a (111) oriented, <0.00 Ωcm, arsenic doped, two-inch wafer. As depicted in FIG. 2, wafer #314 is loaded in reaction cell 24 for anodization. The teachings of the Yue thesis discussed above may be used in the anodization of wafer #314. Electrolyte 26 in reaction cell 24 is a mixture of three quarters in volume of 49% hydrofluoric acid and one quarter of pure ethyl alcohol. With timer controlled DC power supply 28 the current density is set at 300 mA/cm$^2$ and the reaction time is set for 1.6 seconds. By controlling the current density and anodization time, the diameter of pores 16 in FIG. 1 can be varied from 10 Å to 1000 Å with a density of $10^8$ to $10^{11}$ pores per millimeter.

Figure 3:
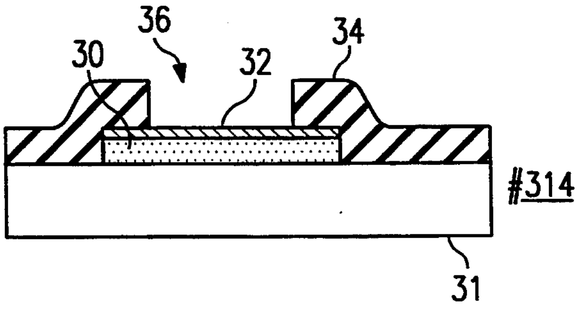
FIG. 3 depicts a cross-sectional view of the structure of OPSFED sample #314.

Referring to FIG. 3, showing a cross-sectional view of the structure of OPSFED #314 after anodization. Wafer #314 is oxidized at 900° C. in dry oxygen for 15 minutes, forming 0.5 μm oxidized porous silicon layer 30 on substrate 31 of wafer #314. Gold evaporation on this layer 30 through a shadow mask is performed at $2\times10^{-6}$ Torr, depositing an array of gold dots with a thickness of 2500 Å and a radius of 0.4 mm. A single gold dot appears in FIG. 3 as layer 32. The oxidized porous silicon without gold cover is then etched away with dilute buffered oxide etch and 1 μm silicon dioxide ($SiO_2$) film 34 is deposited on wafer #314 by RF sputtering. Finally, a circular window 36 with a 0.3 mm radius is opened at the center of each gold dot forming the OPSFEDs.

Figure 4:
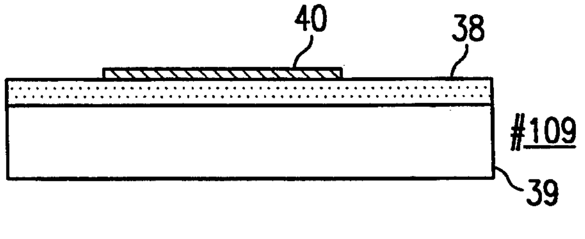
FIG. 4 depicts a cross-sectional view of the structure of OPSFED sample #109.
Figure 8A:
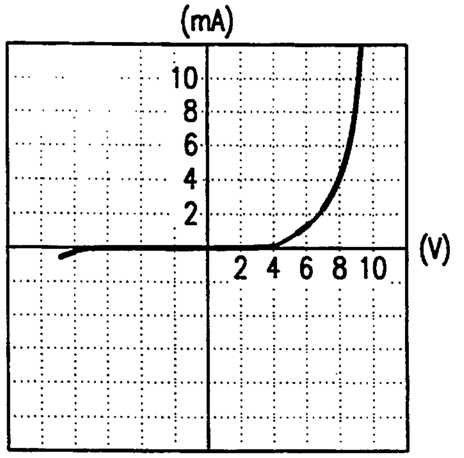
FIGS. 8*a–d* depict the I-V curves for OPSFED sample #314 at different curve tracer ranges.
Figure 8B:
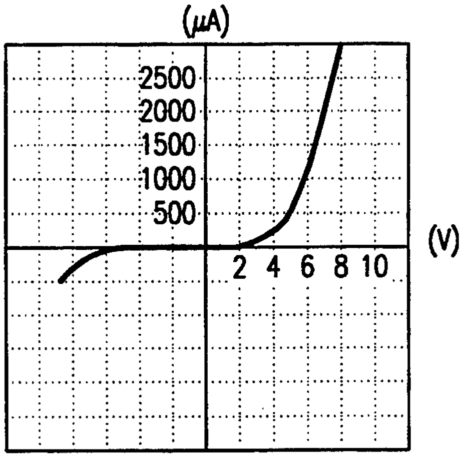
Figure 8C:
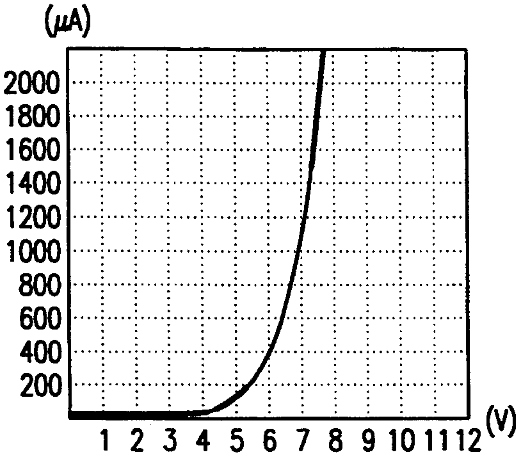
Figure 8D:
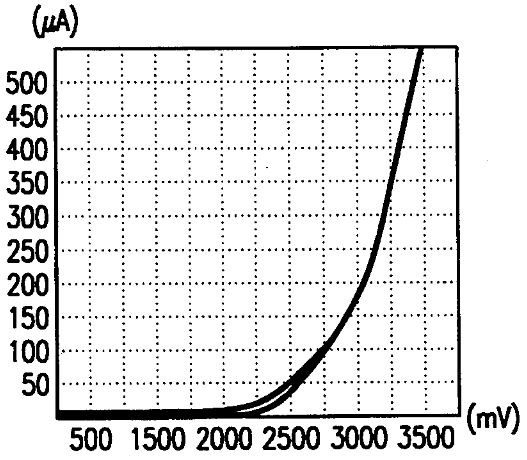

FIG. 4 depicts cross-sectional view of the structure of sample wafer #109. Sample wafer #109 is prepared in a slightly different way than sample wafer #314. Wafer #109 starts with p-type (111) oriented, 0.005 Ωcm, boron doped, two-inch wafer. Wafer #109 undergoes anodization in reaction cell 24 of FIG. 2 with a current density of 300 mA/cm$^2$ and a reaction time of 20 seconds. After dry oxidation at 900° C. for 15 minutes, a 2.2 μm oxidized porous silicon film 38 is formed on substrate 39. Aluminum is evaporated on oxide layer 38 at $2\times10^{-6}$ Torr forming 0.2 μm aluminum film. Photolithography and etch patterning of the aluminum film results in an array of 1 mm$^3$ squares, one of which is represented by layer 40 of FIG. 4, making the OPSFEDs.

RESULTS

Wafer #314 embodying the OPSFED structure of FIGS. 1 and 3 was tested with a regular probe and a curve tracer. The current-to-voltage (I-V) characteristic for sample #314 is shown in FIG. 5 where gold dot 32 is the anode, and silicon substrate 31 is the cathode. In I-V curve 42, a two-way diode characteristic is seen. The reason is that silicon tips 18 are formed in the anodization, and gold tips (not explicitly shown) are formed in the evaporation step. They both can emit electrons under different bias conditions. Silicon tip emitters 18 are turned on in the forward bias at about five volts, and an approximately 13 mA current is provided at ten volts, as shown in FIG. 5. These voltages are compatible with conventional semiconductor circuits. In contrast, under the reverse bias voltage, gold tip emitters are turned on at about nine volts, and less than 2 mA current is provided at ten volts. These differences come from the different geometrical factors of the silicon and gold tips and the different work functions of gold and silicon. When sample #314 was heated to 250° C., no shift of the I-V curve was observed for all the diodes.

The same methodology was used for Sample #109 embodying the structure of FIGS. 1 and 4, which was tested with both a regular probe and a four-stage vacuum microprobe. The I-V curves are identical in the vacuum ($10^{-5}$ Torr) probe and in air, which may indicate that aluminum film 40 has sealed the tiny pores in a vacuum. FIG. 6 shows I-V curve 44 of Sample #109. In the forward bias, silicon tips 18 have a turn-on voltage at about four volts. In reverse bias, the aluminum tip emitters (not explicitly shown) are turned on at about five volts. I-V curve 44 shows some hysterisis 46 and shows higher current density for the same voltage compared to that for n-type sample #314.

Figure 9A:
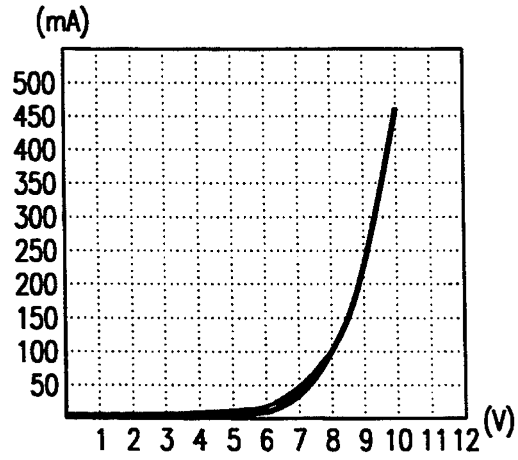
Figure 9B:
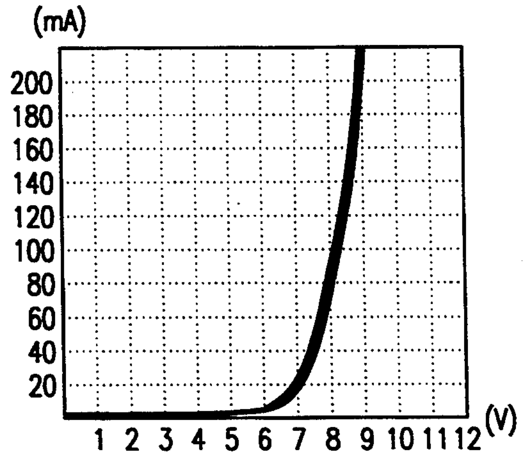

The Fowler-Nordheim (FN) plot for each sample is shown in FIG. 7. Curve 48 is the FN plot for sample #314 and curve 50 is the FN plot for sample #109. The data in the FN plots are collected from FIGS. 8*a*–8*d* for sample #314 and FIGS. 9*a*–96*c* for sample #109. FIGS. 8 and 9 are the I-V curves for samples #314 and #109 respectively with different curve tracer ranges. It is noted that the reverse current for all of the curves in FIGS. 8 and 9 is neglible up to at least 100 volts reverse bias.

POROUS SILICON ELECTRON-EMIT. TING SOURCE EXPERIMENTS

Analysis has been performed on the OPSFED structures of FIGS. 1, 3, and 4 to confirm that the electrons emitted from substrate 12 are by electron vacuum transport in pores 16. In these experiments, anode structure 49 including anode plate 50 was fabricated using a heavily doped p-type silicon wafer with thermally grown silicon dioxide film 52 as depicted in FIG. 10. An array of 4 μm holes 54 was etched through oxide film 52. A 200 Å aluminum film 56 was evaporated on the silicon surface in the bottom of silicon dioxide openings 54 followed by liftoff. Metal film 56 on the anode surface reduces the reverse bias leakage current.

An emitter structure 58 was made using a heavily doped p-type wafer 59 on which porous silicon film 60 is anodically etched and then oxidized. Very similar results are observed with or without thermal oxidation of porous silicon 60, however, those with oxidized porous layer 60 are more stable. Emitter structure 58 is the same as that in OPSFED 10 of FIG. 1 except that no metal film 20 covers oxidized porous layer 60. See "Oxidized Porous Silicon Devices", presented at Third International Vacuum Microelectronic Conference, Monterey, Calif., July, 1990.

A 2.5 mm×2.5 mm piece of this open cathode or emitter structure 58 as depicted in FIG. 10 was placed face-to-face on anode 50, covering 100×100 anode openings 54. The anode and cathode assembly was then placed in vacuum of $10^{-5}$ Torr for electrical testing. The argument is as follows. If the current in OPSFED 58 of FIG. 1 is transported through the solid porous oxide, then in the test structure of FIG. 10, thermally grown silicon dioxide layer 52 of anode 49 will stop the current. On the other hand, if the current in OPSFED 58 is due to the electron vacuum transport in pores 16 depicted in FIG. 1, then the electrons can travel over the vacuum openings on anode 49. The results of the experiment proved the later; that electrons travel in pores 16 of OPSFEDs 10 and 58.

SAMPLE PREPARATION

Anode structure 49 was prepared as follows. For anode 50, three p-type, (111) oriented, 0.020 to 0.025 Ωcm, boron doped wafers (A, B and C) were used in dry oxidation at 1100° C. The oxidation times for anode plates A, B, and C were 48, 58, and 72 minutes respectively, corresponding respectively to oxide layers 52 of 1300 Å, 1530 Å, and 1710 Å. A standard lithographic process was used to produce 100×100 holes 54 in thermal oxide layer 52. Holes 54 were 4 μm in diameter on 25 μm centers. Then, 200 Å aluminum layer 56 was filament evaporated onto the wafer and the photoresist was lifted off.

Pieces of emitter structure 58 (sample #104 and sample #105) were prepared with the following parameters. Silicon wafers 59 were (111) oriented, <0.005 Ωcm, boron doped, two-inch wafers. The electrolyte mixture was three parts of 49% concentration hydrofluoric acid to one part pure ethyl alcohol by volume. The current density and reaction times were set at 250 mA/cm$^2$ and 2.2 seconds for sample #104, and 300 mA/cm$^2$ and 2.0 seconds for sample #105. After anodization, the samples were rinsed, vacuum baked at 135° C. for 15 minutes in dry oxygen gas. Finally, the samples were cut into 2.5 mm×2.5 mm sample pieces. The thickness of oxidized porous silicon layer 60 was measured to be 0.42 μm for sample #104, and 0.44 μm for sample #105.

RESULTS AND DISCUSSIONS

Figure 12:
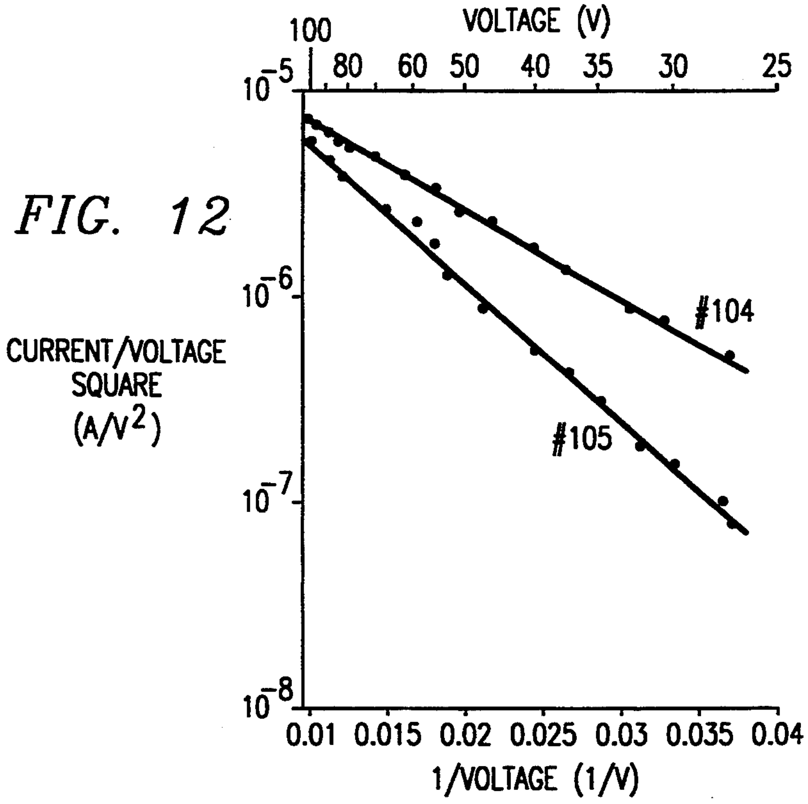
FIG. 12 depicts the Fowler-Nordheim plots for emitter structures #104 and #105.

Anode plate B was selected for emitter structure 58 sample pieces #104 and #105. Each anode-cathode assembly was placed in a vacuum microprober. No current was observed in either forward or reverse bias conditions up to 80 volts when the samples were at atmospheric pressure. When the vacuum microprober was pumped to $10^{-5}$ Torr, I-V relations were measured by a curve tracer as well as current and voltage meters. The I-V plots are shown in FIG. 11, and the Fowler-Nordheim plots in FIG. 12. In FIG. 11, the I-V curve for sample #104 is curve 62 and for sample #105 is curve 64. In FIG. 12, the I-V curve for samples #104 and #105 are curves 66 and 68, respectively. The results show that the I-V relation from Cathode #105 and Anode B follows the FN curve for currents from 50 μA to 50 mA. They also show that in reverse bias there is no current up to −100 volts, and in forward bias the current from sample #104 is higher than that from sample #105. The reasons for the greater current in sample #104 may be due to the smaller pore sizes, denser emission tips, and thinner oxidized porous layer in sample #104.

Figure 13:
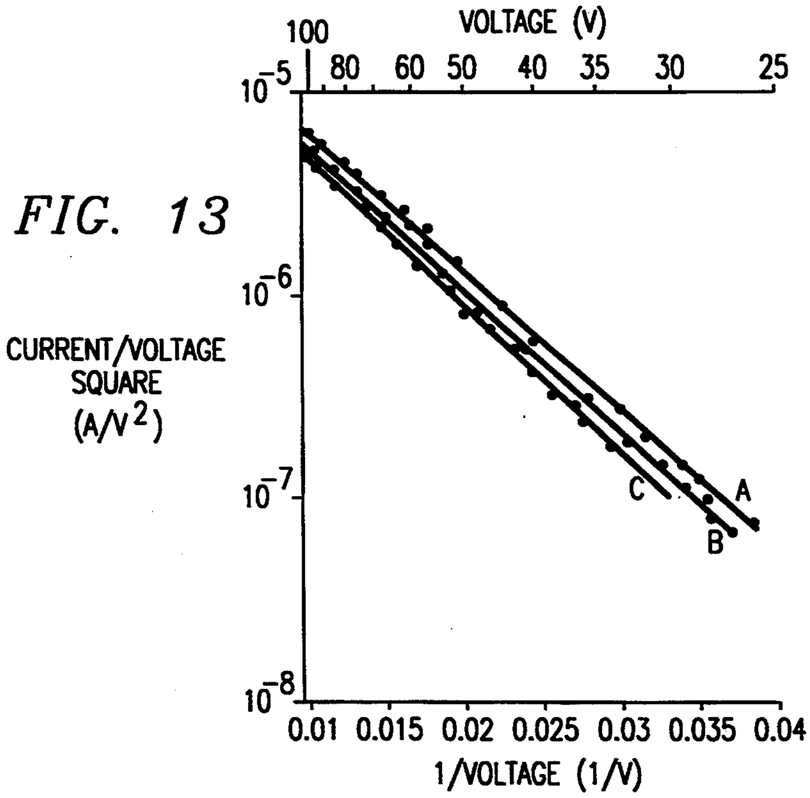
FIG. 13 depicts the Fowler-Nordheim plots for anode structures A, B, and C.

Cathode sample #105 was also tested with anode plate A, B, and C using the same test equipment and conditions. Fowler-Nordheim plots for #105 on anodes A, B, and C are shown in FIG. 13. The thickness of the silicon dioxide layer on the anodes alters the current as shown in the FN plots.

CONCLUSIONS

In these experiments, it was confirmed that electrons are vacuum transported from the electron source which contains the interface of porous silicon and bulk silicon. This kind of electron source produces high emission current at low operating voltage.

Oxidized porous silicon field emission devices utilize the extremely sharp and dense silicon tips formed in the anodization on a bulk silicon substrate. The porous silicon layer and its oxide can be controlled to be very thin so that the electric field on the tips is enormous when a low voltage is applied. OPSFEDs shown in these Figures and discussed in the experiments are insensitive to temperature change. Their I-V characteristics fit the Fowler-Nordheim curves, and their turn-on voltages are well below other electron field emission devices. The porous silicon electron-emitting source is anticipated to find applications in the manufacture of high frequency diodes and triodes, flat panel display devices, as well as in VLSI vacuum microelectronic circuits.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. A method for emitting electrons from a silicon substrate, the method comprising the steps of:
   - anodizing the silicon substrate forming a porous silicon film outwardly from the substrate, the porous silicon film comprising a plurality of pores with sharp silicon tips in the pores at an interface between the silicon substrate and the porous silicon film; and
   - applying a voltage across the substrate and the porous silicon film so that electrons are emitted from the silicon tips and transported in the pores to a surface of the porous silicon film.

2. The method of claim 1 wherein the anodization step is performed electrochemically in concentrated hydrofluoric acid.

3. The method of claim 1 further comprising the steps of:
   - oxidizing the porous silicon film; and
   - forming a metal layer outwardly from at least a portion of the oxidized porous silicon film for collecting electrons emitted from the silicon tips during the applying voltage step.

4. The method of claim 3 wherein the forming of a metal layer step further comprises evaporating one of gold or aluminum outwardly from at least a portion of the oxidized porous silicon film.

5. The method of claim 3, further comprising the steps of:
   - etching the oxidized porous silicon film not covered by the metal layer;

- forming an insulator layer outwardly from the substrate and metal layer; and
   - forming an opening in the insulator layer exposing at least a portion of the metal layer.

6. The method of claim 1 wherein the voltage at which electrons are emitted is no greater than 10 V.

7. The method of claim 1 wherein the anodizing step forms pores in the porous silicon film having a diameter in the range of approximately 10 Å to approximately 1,000 Å.

8. The method of claim 1 wherein the anodizing step forms pores in the porous silicon film having a density in the range of approximately $10^8$ to approximately $10^{11}$ pores per square millimeter.

9. The method of claim 1, wherein the anodizing step forms pores in the porous silicon film having a diameter in the range of approximately 10 Å to approximately 1,000 Å and having a density in the range of approximately $10^8$ to approximately $10^{11}$ pores per square millimeter.

10. The method of claim 1 further comprising the step of forming a metal layer outwardly from at least a portion of the porous silicon film for collecting electrons emitted from the silicon tips during the applying voltage step.

11. The method of claim 10, wherein the forming a metal layer step further comprises evaporating one of gold or aluminum outwardly from at least a portion of the porous silicon film.

12. The method of claim 10 further comprising the steps of:
   - etching the porous silicon film not covered by the metal layer;
   - forming an insulator layer outwardly from the substrate and metal layer; and
   - forming an opening in the insulator layer exposing at least a portion of the metal layer.

13. The method of claim 2, wherein the hydrofluoric acid solution comprises ethyl alcohol.

* * * * *